US006765427B1

(12) United States Patent
McCollum

(10) Patent No.: US 6,765,427 B1
(45) Date of Patent: Jul. 20, 2004

(54) METHOD AND APPARATUS FOR BOOTSTRAPPING A PROGRAMMABLE ANTIFUSE CIRCUIT

(75) Inventor: John McCollum, Saratoga, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 10/216,332

(22) Filed: Aug. 8, 2002

(51) Int. Cl.$^7$ .................. H01H 37/76; H01H 85/00
(52) U.S. Cl. ................................ 327/525; 327/526
(58) Field of Search .................. 327/525, 526; 365/225.7

(56) References Cited

U.S. PATENT DOCUMENTS

| | | | |
|---|---|---|---|
| 4,255,748 A | 3/1981 | Bartlett | 340/661 |
| 4,625,313 A | 11/1986 | Springer | 714/734 |
| 4,638,187 A | 1/1987 | Boler et al. | 326/27 |
| 4,638,243 A | 1/1987 | Chan | 324/509 |
| 4,684,830 A | 8/1987 | Tsui et al. | 326/40 |
| 4,700,130 A | 10/1987 | Bloemen | 324/110 |
| 4,706,216 A | 11/1987 | Carter | 365/94 |
| 4,713,557 A | 12/1987 | Carter | 326/86 |
| 4,717,912 A | 1/1988 | Harvey et al. | 326/46 |
| 4,718,042 A | 1/1988 | Moll et al. | 365/201 |
| 4,742,252 A | 5/1988 | Agrawal | 326/39 |
| 4,772,812 A | 9/1988 | Desmarais | 326/88 |
| 4,800,176 A | 1/1989 | Kakumu et al. | 438/626 |
| 4,857,774 A | 8/1989 | El-Ayat et al. | 326/16 |
| 4,870,300 A | 9/1989 | Nakaya et al. | 326/41 |
| 4,870,302 A | 9/1989 | Freeman | 326/41 |
| 4,873,459 A | 10/1989 | El Gamal et al. | 326/41 |

(List continued on next page.)

FOREIGN PATENT DOCUMENTS

| | | | | |
|---|---|---|---|---|
| EP | 0 415 542 A2 A3 | 3/1991 | ......... | H03K/19/173 |
| EP | 0 889 593 A1 | 1/1999 | ......... | H03K/19/173 |
| EP | 1 137 188 A2 | 9/2001 | ............. | H03L/7/08 |

OTHER PUBLICATIONS

US 6,564,273, 5/2003, Plants (withdrawn)
L. Ashby, "ASIC Clock Distribution using a Phase Locked Loop (PLL)", *Proceedings Fourth Annual IEEE International ASIC Conference and Exhibit*, pp. 6.1–6.3, Sep. 1991.
"AV9170 Clock Synchronizer and Multiplier", pp. 1–4, Nov. 8, 1992.
"AV9170 Application Note", AvaSem, pp. 1–7, Jan. 1993.
U. Ko, "A 30–ps Jitter, 3.6–µs Locking, 3.3–Volt digital PLL for CMOS Gate Arrays", *IEEE 1993 Custom Integrated Circuits Conference*, pp. 23.3.1–23.3.4, Conf. Date: May 9–12, 1993.
A Efendovich et al., "Multi–Frequency Zero–Jitter Delay–Locked Loop", *IEEE 1993 Custom Integrated Circuits Conference*, pp. 27.1.1–27.1.4, Conf. Date: May 9–12, 1993.
R. Quinnell, "Blending gate arrays with dedicated circuits sweetens ASIC development", EDN, pp. 29–32, Mar. 31, 1994.
J. Chen, "PLL–based clock systems span the system spectrum from green PCs to Alpha", EDN, pp. 147–148, 150, 152, 154–155, Nov. 9, 1995.
P. Sevalia, "Straightforward techniques cut jitter in PLL–based clock drivers", EDN, pp. 119–123, 125, Nov. 23, 1995.
D. Bursky, "Memories Hit New Highs And Clocks Run Jitter–Free", Electronic Design, pp. 79, 80, 84, 85, 89 93, Feb. 19, 1996.

*Primary Examiner*—Terry D. Cunningham
*Assistant Examiner*—Quan Tra
(74) *Attorney, Agent, or Firm*—Sierra Patent Group, Ltd.

(57) ABSTRACT

A steering circuit for a programmable circuit employing programming voltages that exceed normal operating voltages comprises a plurality of steering transistors. At least one steering transistor has its gate driven by a bootstrapping transistor.

11 Claims, 4 Drawing Sheets

U.S. PATENT DOCUMENTS

| | | | | |
|---|---|---|---|---|
| 4,928,023 | A | 5/1990 | Marshall | 326/27 |
| 4,930,097 | A | 5/1990 | Ledenbach et al. | 708/230 |
| 4,935,645 | A | 6/1990 | Lee | 327/88 |
| 4,959,561 | A | 9/1990 | McDermott et al. | 326/27 |
| 4,978,905 | A | 12/1990 | Hoff et al. | 323/314 |
| 5,008,855 | A | 4/1991 | Eltoukhy et al. | 365/96 |
| 5,046,035 | A | 9/1991 | Jigour et al. | 708/232 |
| 5,083,083 | A | 1/1992 | El-Ayat et al. | 324/538 |
| 5,121,394 | A | 6/1992 | Russell | 714/726 |
| 5,122,685 | A | 6/1992 | Chan et al. | 326/41 |
| 5,126,282 | A | 6/1992 | Chiang et al. | 438/467 |
| 5,144,166 | A | 9/1992 | Camarota et al. | 326/41 |
| 5,187,392 | A | 2/1993 | Allen | 326/41 |
| 5,194,759 | A * | 3/1993 | El-Ayat et al. | 327/525 |
| 5,198,705 | A | 3/1993 | Galbraith et al. | 326/37 |
| 5,208,491 | A | 5/1993 | Ebeling et al. | 326/41 |
| 5,220,213 | A | 6/1993 | Chan et al. | 326/37 |
| 5,220,215 | A | 6/1993 | Douglas et al. | 326/39 |
| 5,221,865 | A | 6/1993 | Phillips et al. | 326/86 |
| 5,222,066 | A | 6/1993 | Grula et al. | 714/18 |
| 5,258,319 | A | 11/1993 | Inuishi et al. | 438/286 |
| 5,272,388 | A | 12/1993 | Bakker | 327/525 |
| 5,286,922 | A | 2/1994 | Curtiss | 174/112 |
| 5,293,133 | A | 3/1994 | Birkner et al. | 324/713 |
| 5,300,830 | A | 4/1994 | Hawes | 326/41 |
| 5,300,832 | A | 4/1994 | Rogers | 326/57 |
| 5,317,698 | A | 5/1994 | Chan | 710/316 |
| 5,365,485 | A | 11/1994 | Ward et al. | 365/221 |
| 5,367,207 | A | 11/1994 | Goetting et al. | 326/38 |
| 5,375,089 | A | 12/1994 | Lo | 365/189.04 |
| 5,394,033 | A | 2/1995 | Tsui et al. | 326/41 |
| 5,394,034 | A | 2/1995 | Becker et al. | 326/39 |
| 5,396,128 | A | 3/1995 | Dunning et al. | 326/68 |
| 5,397,939 | A | 3/1995 | Gordon et al. | 326/38 |
| 5,399,920 | A | 3/1995 | Van Tran | 326/83 |
| 5,400,262 | A | 3/1995 | Mohsen | 716/16 |
| 5,430,335 | A | 7/1995 | Tanoi | 327/170 |
| 5,430,687 | A | 7/1995 | Hung et al. | 365/230.08 |
| 5,469,003 | A | 11/1995 | Kean | 326/39 |
| 5,469,396 | A | 11/1995 | Eltoukhy | 365/210 |
| 5,473,268 | A | 12/1995 | Declercq et al. | 326/80 |
| 5,485,103 | A | 1/1996 | Pedersen et al. | 326/41 |
| 5,486,775 | A | 1/1996 | Veenstra | 326/98 |
| 5,526,312 | A | 6/1996 | Eltoukhy | 365/201 |
| 5,537,056 | A * | 7/1996 | McCollum | 326/38 |
| 5,537,057 | A | 7/1996 | Leong et al. | 326/41 |
| 5,546,019 | A | 8/1996 | Liao | 326/81 |
| 5,559,464 | A | 9/1996 | Orii et al. | 327/333 |
| 5,572,476 | A | 11/1996 | Eltoukhy | 365/210 |
| 5,666,322 | A | 9/1997 | Conkle | 365/233 |
| 5,670,905 | A | 9/1997 | Keeth et al. | 327/333 |
| 5,744,979 | A | 4/1998 | Goetting | 326/39 |
| 5,744,980 | A | 4/1998 | McGowan et al. | 326/40 |
| 5,801,547 | A | 9/1998 | Kean | 326/40 |
| 5,809,281 | A | 9/1998 | Steele et al. | 711/170 |
| 5,815,003 | A | 9/1998 | Pedersen | 326/39 |
| 5,815,004 | A | 9/1998 | Trimberger et al. | 326/41 |
| 5,821,776 | A | 10/1998 | McGowan | 326/41 |
| 5,825,200 | A | 10/1998 | Kolze | 326/38 |
| 5,825,201 | A | 10/1998 | Kolze | 326/39 |
| 5,825,202 | A | 10/1998 | Tavana et al. | 326/39 |
| 5,825,662 | A | 10/1998 | Trimberger | 326/41 |
| 5,828,230 | A | 10/1998 | Young | 326/41 |
| 5,828,538 | A | 10/1998 | Apland et al. | 361/56 |
| 5,831,448 | A | 11/1998 | Kean | 326/41 |
| 5,832,892 | A | 11/1998 | Yaoita | 123/260 |
| 5,835,165 | A | 11/1998 | Keate et al. | 348/845.1 |
| 5,835,998 | A | 11/1998 | Pedersen | 326/40 |
| 5,838,167 | A | 11/1998 | Erickson et al. | 326/38 |
| 5,838,584 | A | 11/1998 | Kazarian | 716/16 |
| 5,841,723 | A * | 11/1998 | Ma | 365/225.7 |
| 5,844,298 | A * | 12/1998 | Smith et al. | 257/530 |
| 5,847,441 | A | 12/1998 | Cutter et al. | 257/530 |
| 5,847,577 | A | 12/1998 | Trimberger | 326/38 |
| 5,848,005 | A | 12/1998 | Cliff et al. | 365/230.03 |
| 5,848,006 | A | 12/1998 | Nagata | 365/230.06 |
| 5,850,151 | A | 12/1998 | Cliff et al. | 326/39 |
| 5,850,152 | A | 12/1998 | Cliff et al. | 326/40 |
| 5,850,564 | A | 12/1998 | Ting et al. | 712/37 |
| 5,852,608 | A | 12/1998 | Csoppenszky et al. | 370/465 |
| 5,854,763 | A | 12/1998 | Gillingham et al. | 365/189.04 |
| 5,859,542 | A | 1/1999 | Pedersen | 326/39 |
| 5,859,543 | A | 1/1999 | Kolze | 326/41 |
| 5,859,544 | A | 1/1999 | Norman | 326/40 |
| 5,861,761 | A | 1/1999 | Kean | 326/41 |
| 5,869,981 | A | 2/1999 | Agrawal et al. | 326/39 |
| 5,870,586 | A | 2/1999 | Baxter | 395/500 |
| 5,880,492 | A | 3/1999 | Duong et al. | 257/209 |
| 5,880,512 | A | 3/1999 | Gordon et al. | 257/530 |
| 5,880,597 | A | 3/1999 | Lee | 326/41 |
| 5,880,598 | A | 3/1999 | Duong | 326/41 |
| 5,883,526 | A | 3/1999 | Reddy et al. | 326/41 |
| 5,883,850 | A | 3/1999 | Lee et al. | 365/230.03 |
| 5,949,719 | A | 9/1999 | Clinton et al. | 365/189.01 |
| 5,952,847 | A | 9/1999 | Plants et al. | 326/80 |
| 5,994,934 | A | 11/1999 | Yoshimura et al. | 327/158 |
| 6,011,744 | A | 1/2000 | Sample et al. | 365/230.03 |
| 6,034,677 | A | 3/2000 | Noguchi et al. | 345/327 |
| 6,038,627 | A | 3/2000 | Plants | 710/126 |
| 6,049,487 | A | 4/2000 | Plants et al. | 365/189.04 |
| 6,111,448 | A | 8/2000 | Shibayama | 327/293 |
| 6,289,068 | B1 | 9/2001 | Hassoun et al. | 375/376 |
| 6,292,016 | B1 | 9/2001 | Jefferson et al. | 326/39 |
| 6,329,839 | B1 | 12/2001 | Pani et al. | 326/41 |
| 6,430,088 | B1 | 8/2002 | Plants et al. | 365/189.04 |
| 6,437,650 | B1 | 8/2002 | Sung et al. | 331/25 |
| 6,496,887 | B1 | 12/2002 | Plants | 710/100 |

* cited by examiner

US 6,765,427 B1

METHOD AND APPARATUS FOR BOOTSTRAPPING A PROGRAMMABLE ANTIFUSE CIRCUIT

BACKGROUND OF THE DISCLOSED SYSTEM

1. Field of the Disclosed Circuit

The present disclosed circuit relates to programming antifuses, including those in field-programmable gate arrays ("FPGAs").

2. Description of the Related Art

Antifuse devices are well known in the integrated circuit art. Antifuse devices comprise a pair of conductive electrodes separated by at least one layer of antifuse material and may include one or more diffusion barrier layers. Prior to programming, antifuses exhibit very high resistance between the two electrodes and may be considered to be open circuits. A programming process disrupts the antifuse material and creates a low-impedance connection between the two conductive electrodes.

Programming circuit overhead for FPGA's takes up a great deal of die space. Reduction of this overhead represents a significant cost savings for manufacturers.

Referring to FIG. 1, antifuse 10 is shown coupled between two wiring segments 12 and 14. If the antifuse 10 is programmed, a connection is created between wiring segments 12 and 14 through the antifuse 10. First and second steering transistors 16 and 18 are coupled between wiring segment 12 and a source of programming potential $V_{PP}$. Third and fourth steering transistors 22 and 24 are coupled between wiring segment 14 and a ground potential 26. The steering transistors 16, 18, 22, and 24 are used to steer the programing potentials $V_{PP}$ and ground to the antifuse 10 to be programmed. Antifuse 10 is programmed when all four steering transistors are turned on. In the example of FIG. 1, $V_g$ for all of steering transistors 16, 18, 22, and 24 is set at 7 volts.

As may be seen from an examination of FIG. 1, third and fourth steering transistors each have small source bias voltages. Steering transistor 24 has a zero-volt source bias because its source is coupled directly to ground and steering transistor 22 has a 1-volt source bias caused by the voltage drop across transistor 24. Therefore $V_{GS}$ for steering transistor 24 will be 7 volts and $V_{GS}$ for steering transistor 22 will be 6 volts.

On the other hand, first and second steering transistors 16 and 18 each have a large source bias ($V_s$), 3 and 5 volts respectively in the design illustrated in FIG. 1 where $V_{PP}$ is 6 volts. Seven volts is applied to the gates of each of the four steering transistors in this particular design. The gate voltage and large source bias on steering transistors 16 and 18 result in low $V_{GS}$ voltages of 2 and 4 volts respectively across those transistors. Due to the low $V_{GS}$ voltages, the driver currents in transistors 16 and 18 are low, thus to compensate, the transistors 16 and 18 must be made larger in order to properly program an antifuse. As the size of the steering transistors increase the size of the die increases, thereby increasing costs. Also, with larger transistors, capacitance increases, thereby slowing the speed of the operating circuit.

BRIEF SUMMARY OF THE DISCLOSED CIRCUITS

The disclosed circuits relate to a programming steering circuit comprising a plurality of steering transistors and at least one bootstrapping transistor. The drain of the at least one bootstrapping transistor is coupled to the gate of at least one of the steering transistors.

A better understanding of the features and advantages of the present disclosed system will be obtained by reference to the following detailed description of the disclosed system and accompanying drawings which set forth an illustrative embodiment in which the principles of the disclosed system are utilized.

DETAILED DESCRIPTION OF THE DISCLOSED CIRCUITS

Persons of ordinary skill in the art will realize that the following description of the present invention is illustrative only and not in any way limiting. Other embodiments of the invention will readily suggest themselves to such skilled persons having the benefit of this disclosure.

Figure 1:
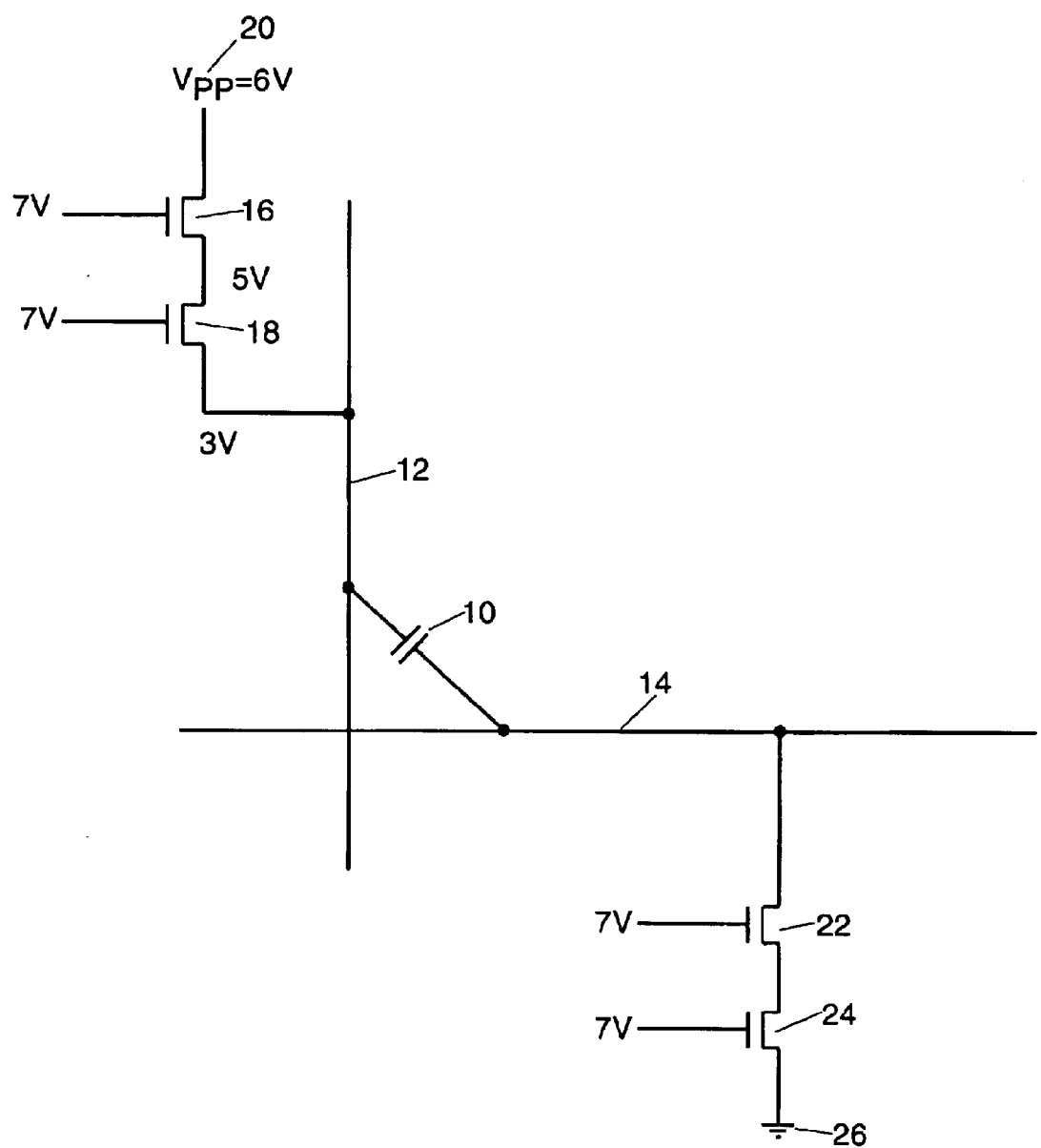
FIG. 1 is an illustration of a prior-art antifuse programming circuit.
Figure 2:
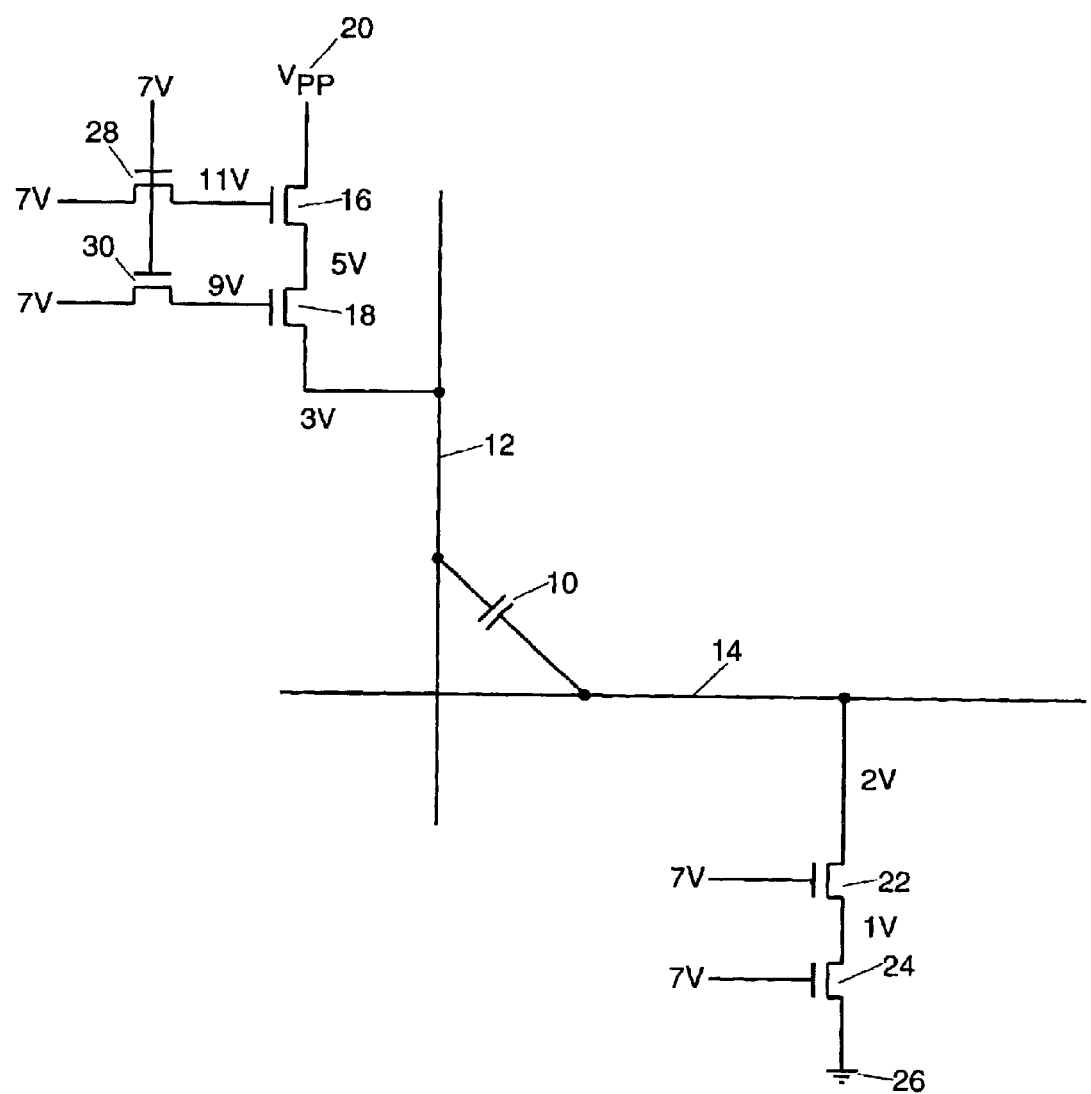
FIG. 2 is a simplified schematic diagram of one embodiment of the disclosed circuit.

Recent scaling of transistors has lowered gate breakdowns such that they are now much lower than junction breakdowns. This scaling thus makes it possible to use capacitive bootstrapping to improve the performance of antifuse programming circuits such as the one shown in FIG. 1. Referring now to FIG. 2, the same antifuse 10 is shown coupled between the same two wiring segments 12 and 14. As in the programming circuit of FIG. 1, first and second steering transistors 16 and 18 are shown coupled between wiring segment 12 and a source of programming potential $V_{PP}$, and third and fourth steering transistors 22 and 24 are shown coupled between wiring segment 14 and a ground potential 26. Antifuse 10 is programmed when all four steering transistors are turned on.

As may be seen from an examination of FIG. 2, the gate-drive signals for first and second steering transistors 16 and 18, respectively, are supplied through bootstrap transistors 28 and 30 respectively. As in the circuit of FIG. 1, $V_g$ for steering transistors 22 and 24 is set at 7 volts and the gates of bootstrap transistors 28 and 30 are driven from a common gate line at a $V_g$ potential of 7 volts.

Figure 3A:
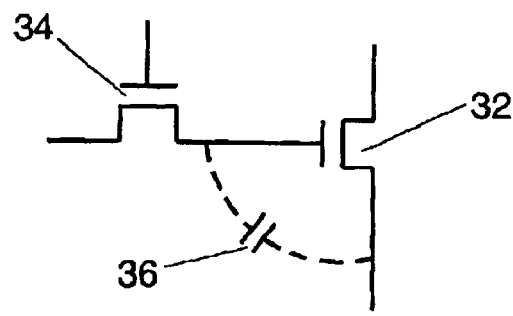
FIG. 3A is an equivalent schematic diagram of a portion of the circuit of FIG. 2 illustrating the bootstrapping action.
Figure 3B:
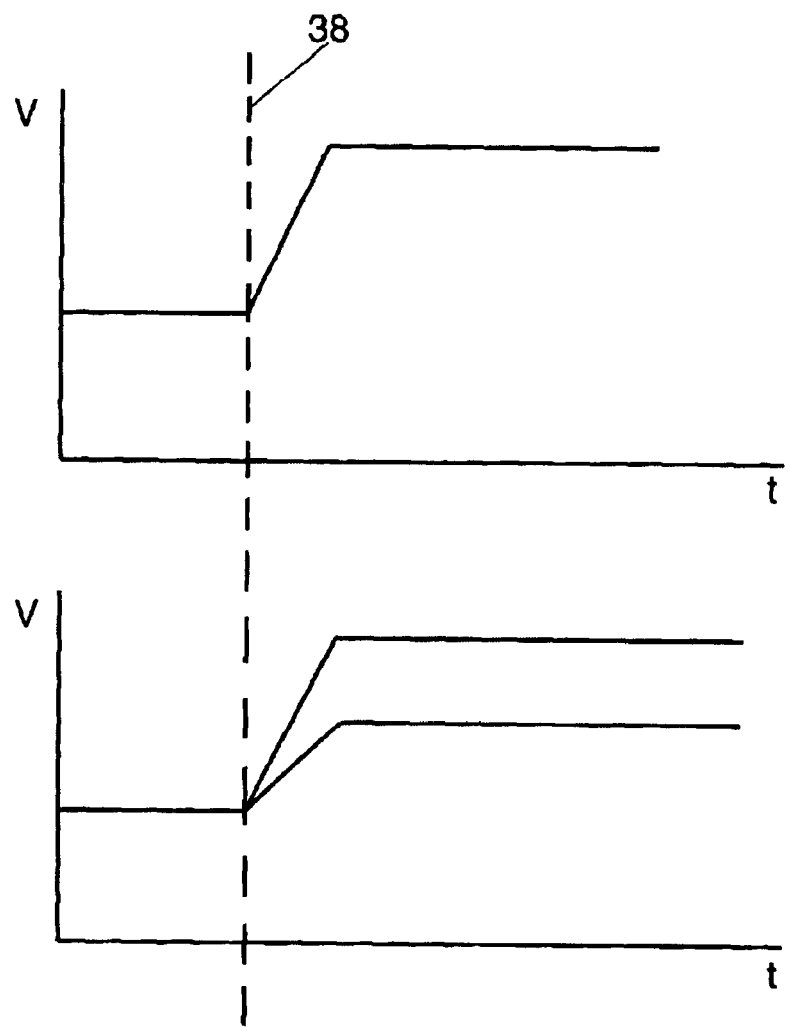
FIG. 3B is a graph showing the voltage bootstrapping action of the circuit of FIG. 3A.

As will be appreciated by persons or ordinary skill in the art, bootstrapping is the use of the capacitance of a node to increase the voltage on a gate of a transistor as the voltage rises at its source. Referring now to FIGS. 2 and 3A and 3B, when it is desired to program antifuse 10 in the circuit of FIG. 2, ground potential is supplied to wiring segment 14 through steering transistors 22 and 24 and $V_{PP}$ potential is supplied to wiring segment 12 through steering transistors 16 and 18. As may be seen from FIG. 2, seven volts is supplied to the left-hand source/drain terminal of each of bootstrap transistors 28 and 30 and the gates of both bootstrap transistors 28 and 30 are driven to 7 volts. When the $V_{PP}$ potential is then raised to 6 volts, bootstrap action causes the potential at the gate of steering transistor 16 to rise to 11 volts and the potential at the gate of steering transistor 18 to rise to 9 volts. Under these conditions, it may be seen that $V_{GS}$ for steering transistor 16 is 6 volts and $V_{GS}$ for steering transistor 18 is also 6 volts, thus avoiding the problem with the circuit of FIG. 1. Those of ordinary skill in the art will observe that applying 7 volts to the source of transistors 28 and 30 has the effect of making those transistors act like diodes.

This action may be seen in FIGS. 3A and 3B. FIG. 3A is an equivalent schematic diagram of the circuit including a steering transistor 32 in combination with a bootstrap transistor 34. Dashed line capacitor 36 is the capacitance on the gate of the steering transistor 32 which is the dominating capacitance. The top trace of FIG. 3B shows the voltage at the gate of steering transistor 32. Dashed line 38 in FIG. 3B indicates the time at which $V_{PP}$ is turned on and shows that the voltage on the gate of steering transistor 32 is bootstrapped from an initial value to a higher value by the capacitance of the gate. The two lower traces of FIG. 3B illustrate the relative bootstrapping of the voltages on the gates of steering transistors 16 and 18 of FIG. 2 to a higher voltage when $V_{PP}$ is applied to the drain of steering transistor 16.

This design allows for the steering transistors 16 and 18 to be smaller, which saves die area and reduces capacitance, thereby reducing cost and increasing operating speed.

Figure 4:
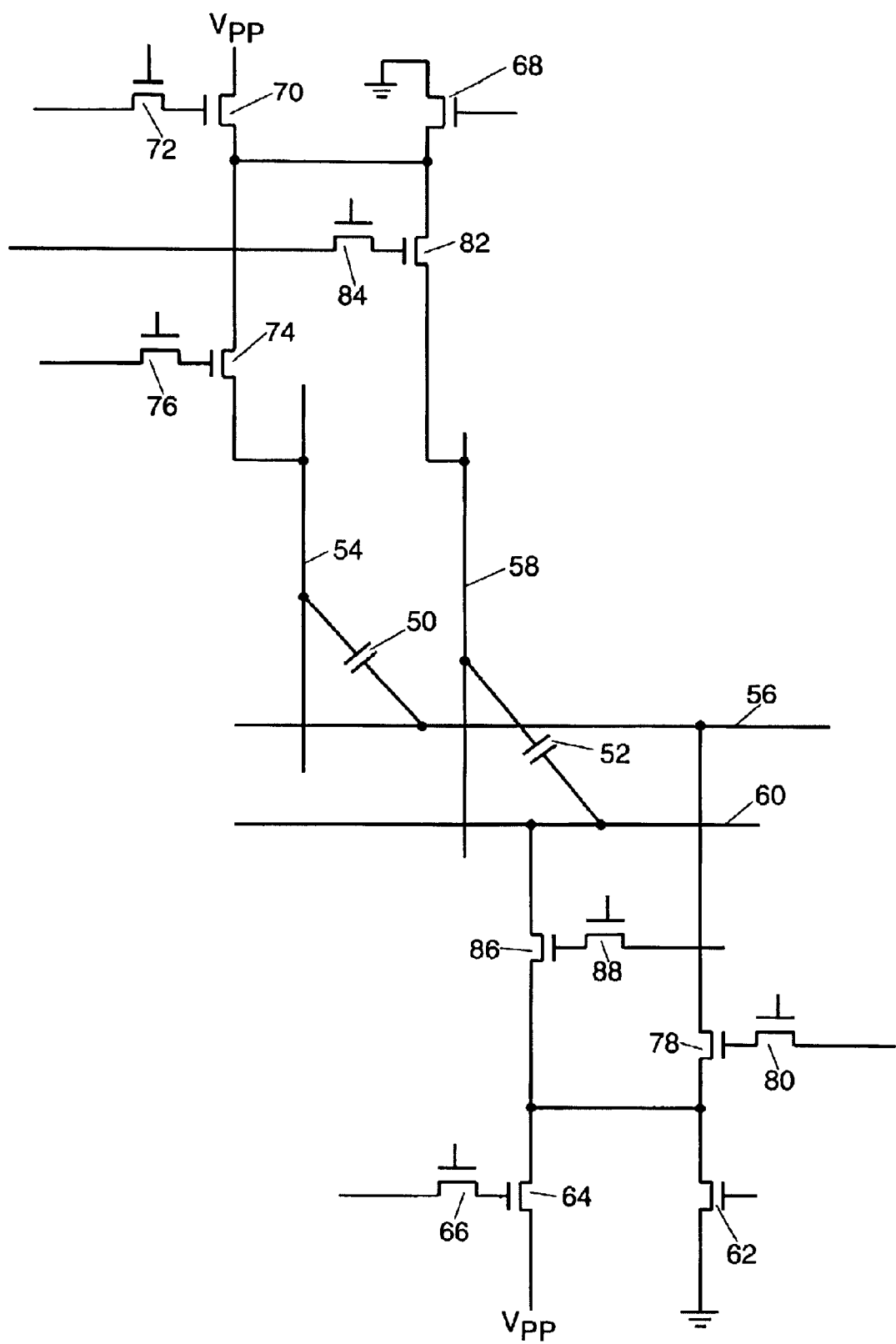
FIG. 4 is a simplified schematic of another embodiment of the disclosed circuit with two programmable antifuses.

Referring to FIG. 4, one embodiment of an illustrative circuit providing a bidirectional programming path to allow programming of two antifuses 50 and 52 is shown. Antifuse 50 is coupled between wiring segments 54 and 56 and antifuse 52 is coupled between wiring segments 58 and 60.

The programming circuits for antifuses 50 and 52 both share the same pre-driver transistors 62, 64, 66, 68, 70, and 72. Steering transistors 74 and 78 and bootstrap transistors 76 and 80 are used to program antifuse 50, and steering transistors 82 and 86, and bootstrap transistors 84 and 88 are used to program antifuse 52. The gates of transistors 66, 72, 76, 80, and 88 may be always left high at a $V_g$ potential.

As an example of the operation of the circuit of FIG. 4, if antifuse 50 is to be programmed, then steering transistors 74 and 78 must be turned on and steering transistors 82 and 86 must be kept off in order to prevent antifuse 52 from being programmed. In addition, steering transistors 62 and 70 must be turned on in order to complete the current path if the most positive potential is to be supplied to antifuse 50 through wiring segment 54. The gates of bootstrap transistors 66, 72, 76, 80 and 88 must be taken to $V_g$. This charges the gates of steering transistors 70, 74, and 78 to one threshold voltage below the sources of bootstrap transistors 72, 76, and 80 prior to ramping up the $V_{PP}$ voltage. Turning on bootstrap transistors 66 and 88 allows the gate turn-off signal to be presented to the gates of steering transistors 64 and 86. Once this has been done, $V_{PP}$ can be ramped from zero to the desired voltage. This causes the potentials at the gates of steering transistors 70, 74, and 78 to rise with $V_{PP}$ thereby maintaining the current-drive capability of these steering transistors as their source voltages rise.

If it is desired to program antifuse 50 with current flow in the opposite direction, then steering transistors 64 and 68 would be turned on instead of steering transistors 62 and 70.

From the above example of programming antifuse 50, persons of ordinary skill in the art will understand how to program antifuse 52 by turning off steering transistors 74 and 78 by applying zero volts to the sources of bootstrap transistors 76 and 80 and turning on steering transistors 82 and 86 by applying the same voltage as $V_g$ to the gates of bootstrap transistors 84 and 88. Persons of ordinary skill in the art will also observe that, if programming current flow in only one direction is desired, steering transistors 64, bootstrap transistor 66, and steering transistor 68 would not be needed.

It should be understood that various alternatives to the embodiments of the disclosed invention described herein may be employed in practicing the disclosed invention. It is intended that the following claims define the scope of the disclosed invention and that structures and methods within the scope of these claims and their equivalents be covered thereby.

What is claimed is:

1. A programming-voltage steering circuit for a voltage-programmable element, said programming steering circuit comprising:

a first steering transistors coupled between said voltage programmable element and a first programming potential, said first steering transistor having a bootstrapped gate; and a second steering transistor coupled between said voltage programmable element and a second programming potential, said second steering transistor having a bootstrapped gate.

2. The programming-voltage steering circuit of claim 1 wherein said voltage-programmable element comprises an antifuse.

3. The programming-voltage steering circuit of claim 1 wherein said bootstrapped gate comprises a bootstrapping transistor having a first source/drain terminal coupled to the gate of said at least one of said steering transistors, a second source/drain terminal coupled to a source of a first control signal and a gate coupled to a source of a second control signal.

4. The programming-voltage steering circuit of claim 3 wherein said voltage-programmable element comprises an antifuse.

5. The programming-voltage steering circuit of claim 3 wherein said source of a first control signal and said source of a second control signal are the same.

6. A programming-voltage steering circuit for programming a voltage-programmable element coupled between a first circuit node and a second circuit node and comprising:

a first steering transistor and a second steering transistor coupled in series between a source of programming potential and the first circuit node, said first steering transistor and said second steering transistor each having a gate;

a third steering transistor and a fourth steering transistor coupled in series between ground potential and the second circuit node, said first steering transistor and said second steering transistor each having a gate;

a first bootstrapping transistor coupled to drive the gate of said first steering transistor;

a second bootstrapping transistor coupled to drive the gate of said second steering transistor; and a third bootstrapping transistor coupled to drive the gate of said third steering transistor.

7. The programming-voltage steering circuit of claim 6 wherein;

said first bootstrapping transistor has a first source/drain terminal coupled to said gate of said first steering transistor, a second source/drain terminal coupled to a first control voltage source, and a gate coupled to a second control voltage source; and said second bootstrapping transistor has a first source/drain terminal coupled to said gate of said second steering transistor, a second source/drain terminal coupled to a third control voltage source, and a gate coupled to a fourth control voltage source.

8. The programming-voltage steering circuit of claim 7 wherein said first through fourth control voltage source are the same.

9. The programming-voltage steering circuit of claim 6 wherein said voltage-programmable element comprises an antifuse.

10. A method for programming a voltage-programmable element coupled to a switchable programming potential comprising;

driving a gate of a first steering transistor through a first bootstrap transistor coupled between a first programming potential and the voltage-programmable element;

driving a gate of a second steering transistor through a second bootstrap transistor coupled between a second programming potential and the voltage-programmable element; and turning on said first programming potential.

11. A programming-voltage steering circuit for programming a voltage-programmable element coupled between a first circuit node and a second circuit node, comprising:

a first steering transistor and a second steering transistor coupled in series between a source of programming potential and the first circuit node, said first steering transistor and said second steering transistor each having a gate;

a third steering transistor and a fourth steering transistor coupled in series between ground potential and the second circuit node, said third steering transistor and said fourth steering transistor each having a gate;

a first bootstrapping transistor coupled to drive the gate of said first steering transistor;

a second bootstrapping transistor coupled to drive the gate of said second steering transistor;

a third bootstrapping transistor coupled to drive the gate of said third steering transistor;

a fifth steering transistor and a sixth steering transistor coupled in series between said source of programming potential and said second circuit node, said fifth steering transistor and said sixth steering transistor each having a gate;

a seventh steering transistor and an eighth steering transistor coupled in series between said ground potential and said first circuit node, said seventh steering transistor and said eighth steering transistor each having a gate;

a fourth bootstrapping transistor coupled to drive the gate of said fifth steering transistor;

a fifth bootstrapping transistor coupled to drive the gate of said sixth steering transistor; and a sixth bootstrapping transistor coupled to drive the gate of said seventh steering transistor.

* * * * *